United States Patent
Lee et al.

(10) Patent No.: US 7,358,524 B2
(45) Date of Patent: Apr. 15, 2008

(54) NANOWIRE DEVICE AND METHOD OF FABRICATING THE SAME

(75) Inventors: Hyo-sug Lee, Suwon-si (KR);
Sung-hoon Lee, Yongin-si (KR);
Young-gu Jin, Hwaseong-si (KR);
Jong-seob Kim, Suwon-si (KR);
Sung-il Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 164 days.

(21) Appl. No.: 11/406,255

(22) Filed: Apr. 19, 2006

(65) Prior Publication Data

US 2007/0032076 A1 Feb. 8, 2007

(30) Foreign Application Priority Data

May 2, 2005 (KR) .................... 10-2005-0036684

(51) Int. Cl.
| | |
|---|---|
| H01L 29/06 | (2006.01) |
| H01L 31/072 | (2006.01) |
| H01L 31/109 | (2006.01) |
| H01L 31/0328 | (2006.01) |
| H01L 31/0336 | (2006.01) |
| H01L 35/24 | (2006.01) |
| H01L 51/00 | (2006.01) |
| H01L 33/00 | (2006.01) |

(52) U.S. Cl. .................... 257/14; 257/17; 257/40; 257/79

(58) Field of Classification Search ............. 257/9–18, 257/40, 79
See application file for complete search history.

(56) References Cited

U.S. PATENT DOCUMENTS

| 7,122,827 B2* | 10/2006 | Alizadeh et al. ............... 257/17 |
| 2007/0235738 A1* | 10/2007 | Jin et al. ....................... 257/79 |
| 2007/0267625 A1* | 11/2007 | Wang et al. ................... 257/14 |

* cited by examiner

*Primary Examiner*—Cuong Nguyen
(74) *Attorney, Agent, or Firm*—Sughrue Mion, PLLC

(57) ABSTRACT

A nanowire device having a structure allowing for formation of p-type and n-type doped portions in a nanowire, and a method of fabricating the same. The nanowire device includes a substrate, a first electrode layer formed on the substrate, a second electrode layer facing the first electrode layer, a plurality of nanowires interposed at a predetermined interval between the first electrode layer and the second electrode layer to connect the same, and an electrolyte containing an electrolytic salt filling spaces between the nanowires.

13 Claims, 5 Drawing Sheets

Ion Concentration
in-between the Nanowires

Band Diagram & Carrier distribution
within Nanowire

NANOWIRE DEVICE AND METHOD OF FABRICATING THE SAME

CROSS-REFERENCE TO RELATED PATENT APPLICATION

This application claims the benefit of Korean Patent Application No. 10-2005-0036684, filed on May 2, 2005, in the Korean Intellectual Property Office, the disclosure of which is incorporated herein in its entirety by reference.

BACKGROUND OF THE INVENTION

1. Field of the Invention

The present invention relates to a nanowire device and a method of fabricating the same, and more particularly, to a nanowire device having an improved structure allowing easy formation of p-type and n-type doped portions in nanowires, and a method of fabricating the same.

2. Description of the Related Art

A light emitting diode (LED) using gallium nitride (GaN) based compound semiconductors has been abundantly researched as a light emitting device. Although a GaN-based compound semiconductor light emitting device has a high light emitting efficiency, there is a problem of mismatch with a substrate, thus making it difficult for use in producing a large size device.

Technologies using nanostructures such as a nanowire for light emitting devices are under development. Japanese Patent Laid-Open Publication No. Hei 10-326888 discloses a light emitting device having nanowires made of silicon and a method of fabricating the light emitting device. After a catalytic layer such as gold is deposited on a substrate, a silicon nanowire is grown from the catalytic layer by flowing silicon tetrachloride ($SiCl_4$) gas into a reactor.

The silicon nanowire light emitting device, however, is known to have a low light emitting efficiency although it can be manufactured at low cost.

U.S. patent Publication No. 2003/0168964 discloses a nanowire light emitting device having a p-n diode structure. In this case, a lower portion of the nanowire light emitting device is formed of an n-type nanowire, an upper portion is formed of a p-type nanowire, and the nanowire light emitting device emits light from a junction region between the two portions. Other components are added using a vapor phase-liquid phase-solid phase (VLS) method in order to fabricate the nanowire light emitting device having the p-n junction structure.

Since the nanowire having the p-n junction structure is grown on a catalytic layer and the n-type and p-type nanowires are sequentially formed, the manufacturing process is complicated and it is difficult to obtain a high quality p-n junction structure.

SUMMARY OF THE INVENTION

The present invention provides a nanowire device having an improved structure allowing for easy formation of p-type and n-type doped portions in a nanowire, and a method of fabricating the same.

According to a first aspect, the present invention provides a nanowire device including a substrate, a first electrode layer formed on the substrate, a second electrode layer facing the first electrode layer, a plurality of nanowires interposed at a predetermined interval between the first electrode layer and the second electrode layer to connect the same, and an electrolyte containing an electrolytic salt filling spaces between the nanowires.

According to another aspect, the present invention provides a method of fabricating a nanowire device including: preparing a substrate; forming a first electrode layer on the substrate; forming a plurality of nanowires vertically on the first electrode layer at a predetermined interval; filling spaces between the nanowires with an electrolyte containing an electrolytic salt; and forming a second electrode layer covering the electrolyte and the nanowires.

The nanowire may be made of at least one of zinc oxide (ZnO), tin dioxide ($SnO_2$), indium oxide ($In_2O_3$), nickel oxide (NiO), gallium nitride (GaN), titanium dioxide ($TiO_2$), magnesium oxide (MgO), silicon, and carbon nanotubes (CNT). The electrolytic salt may include at least one of NaCl, $LiClO_4$, LiBr, LiI, $LiAsF_6$, $LiPF_6$, $LiAlCl_4$, $LiBF_4$, $LiCF_3SO_3$, $LiN(SO_2CF_3)_2$, $LiC(SO_2CF_3)_3$, $Li_2S_2O_4$, $TBABF_4$, $Li_2B_{10}Cl_{10}$, and $LiAlClO_4$. The electrolyte may include at least one of a liquid electrolyte and a polymer electrolyte. The liquid electrolyte may include at least one of ethylene carbonate, propylene carbonate, ethyl methyl carbonate, diethyl carbonate, diethyl ether, tetrahydrofuran, 1,3-dioxolane, methyl formate, γ-butyrolactone, methylacetate, acetonitrile, nitromethane, N,N-dimethyl formamide, dimethyl sulfoxide, sulfolane, methylene chloride, and water. Further, the polymer electrolyte may include at least one of polyethylene oxide, polypropylene oxide, polyacrylonitrile, polyvinylidene difluoride, polyoxymethylene-oligo-oxymethylene, and polymethylmethacrylate.

The present invention provides a nanowire device having an improved structure allowing for easy formation of p-type and n-type doped portions in the nanowire.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
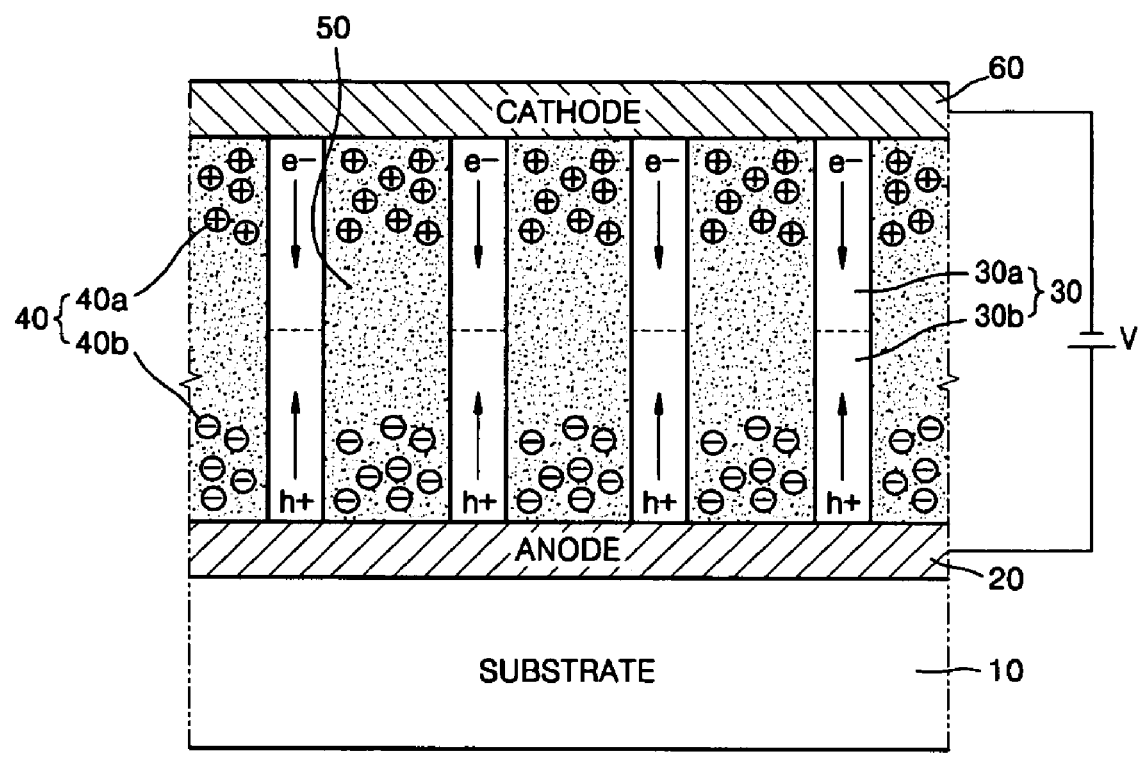
FIG. 1 is a schematic cross-sectional view of a nanowire device according to an exemplary embodiment of the present invention.

Hereinafter, exemplary embodiments of a nanowire device and a method of fabricating the same according to the present invention will be described in detail with reference to the attached drawings. However, the present invention should not be construed as being limited thereto. In the drawings, the thicknesses of layers and regions are exaggerated for clarity.

FIG. 1 is a schematic cross-sectional view of a nanowire device according to an exemplary embodiment of the present invention.

Referring to FIG. 1, a nanowire device according to an exemplary embodiment of the present invention includes a substrate 10, a first electrode layer 20 formed on the substrate 10, a second electrode layer 60 facing the first electrode layer 20, a plurality of nanowires 30 interposed between the first electrode layer and the second electrode layer, and an electrolyte 50 containing an electrolytic salt 40 filling spaces between the nanowires 30.

Various materials can be used for the substrate 10. For example, a transparent substrate, such as a sapphire, glass, and plastic substrates, or a silicon substrate, can be used without limitation.

The first electrode layer 20 and the second electrode layer 60 are each made of a conductive material. Holes can be injected into the first electrode layer 20 and electrons can be injected into the second electrode layer 60. Although there is no specific limitation with respect to materials of the first and second electrode layers, at least one of the two electrode layers 20, 60 may be made of a transparent material. For example, the electrode layer 20 may be made of a material having a high work function, such as indium tin oxide (ITO), and the second electrode layer 60 may be made of a material having a low work function, for example, a metal, such as aluminum, magnesium, indium, calcium, etc. Therefore, while using the first electrode layer 20 having a high work function as an anode, and the second electrode layer 60 having a low work function as a cathode, a forward bias is applied across to the nanowire device to inject holes and electrons into the nanowires 30. The function of the first and second electrode layers may be switched, depending on the desired device design.

The nanowires 30 are interposed between the first electrode layer 20 and the second electrode layer 60 to connect the first electrode layer 20 and the second electrode layer 60. In particular, a plurality of the nanowires 30 is prepared vertically on the first electrode layer 20 at a predetermined interval. The nanowire may be formed of at least one material selected from among zinc oxide (ZnO), tin dioxide ($SnO_2$), indium oxide ($In_2O_3$), nickel oxide (NiO), gallium nitride (GaN), titanium dioxide ($TiO_2$), magnesium oxide (MgO), silicon (Si), and carbon nanotubes (CNT). When a predetermined voltage is applied to the nanowires 30, light is emitted in a range of wavelengths which varies depending on the material of the nanowires. For example, ultraviolet rays are emitted when the nanowire 30 is made of ZnO, infrared rays are emitted when the nanowire 30 is made of Si, ultraviolet rays or blue light is emitted when the nanowire 30 is made of GaN, blue light is emitted when the nanowire 30 is made of Indium gallium nitride (InGaN), green light is emitted when the nanowire 30 is made of cadmium sulfide (CdS), and red light is emitted when the nanowire 30 is made of gallium arsenic (GaAs). The diameters of the nanowires 30 are about 1 µm or less and the lengths thereof are about 10 µm or less. The nanowires 30 may be formed with a diameter in the range of 5-200 nm and a length in the range of 100 nm-2 µm.

The spaces between the nanowires 30, particularly, the spaces between vertically aligned and adjacent nanowires 30, are filled with an electrolyte 50 containing an electrolytic salt 40. The electrolytic salt 40 dissociates into cations 40a and anions 40b in the electrolyte 50. When a predetermined voltage is applied to the first and second electrode layers, one of the electrode layers to which a positive voltage is applied becomes an anode and the other electrode layer to which a negative voltage is applied becomes a cathode. The dissociated cations 40a and anions 40b migrate to the cathode electrode 60 and anode electrode 20, respectively, to thereby polarize the device.

Cations 40a migrating to the cathode electrode 60 actively attract electrons from the cathode electrode 60 by coulomb force to portions of the nanowires 30a near the cations 40a, forming an n-type doped portion 30a (by injection of electrons from the cathode electrode 60 to nanowires 30a). Similarly, anions 40b migrating to the anode electrode 20 actively attract holes from the anode electrode 20 by the coulomb force to portions of nanowires 30b near the anions 40b, forming a p-type doped portion 30b. The n-type doped portion 30a and the p-type doped portion 30b are formed in each of the nanowires 30, resulting in a p-n junction nanowire device. The electrolytic salt may include at least one of NaCl, $LiClO_4$, LiBr, LiI, $LiAsF_6$, $LiPF_6$, $LiAlCl_4$, $LiBF_4$, $LiCF_3SO_3$, $LiN(SO_2CF_3)_2$, $LiC(SO_2CF_3)_3$, $Li_2S_2O_4$, $TBABF_4$, $Li_2B_{10}Cl_{10}$, and $LiAlClO_4$. The electrolyte 50 may include at least one of a liquid electrolyte and a polymer electrolyte. The liquid electrolyte may include at least one of ethylene carbonate, propylene carbonate, ethyl methyl carbonate, diethyl carbonate, diethyl ether, tetrahydrofuran, 1,3-dioxolane, methyl formate, γ-butyrolactone, methylacetate, acetonitrile, nitromethane, N,N-dimethyl formamide, dimethyl sulfoxide, sulfolane, methylene chloride, and water. The polymer electrolyte may include at least one of polyethylene oxide, polypropylene oxide, polyacrylonitrile, polyvinylidene difluoride, polyoxymethylene-oligo-oxymethylene, and polymethylmethacrylate.

A conventional method of doping nanowires is either n-type or p-type doping. In the present invention, however, the structure of nanowire is improved to allow easy formation of p-type and n-type doped portions. In particular, using cations and anions dissociated from an electrolytic salt, it is possible to simultaneously form n-type and p-type doped portions in individual nanowires. A nanowire device having such a structure has an excellent p-n junction property and improved characteristics. When a light emitting device is made using a nanowire device of the present invention, the light emitting efficiency is improved due to the excellent p-n junction property.

Figure 2:
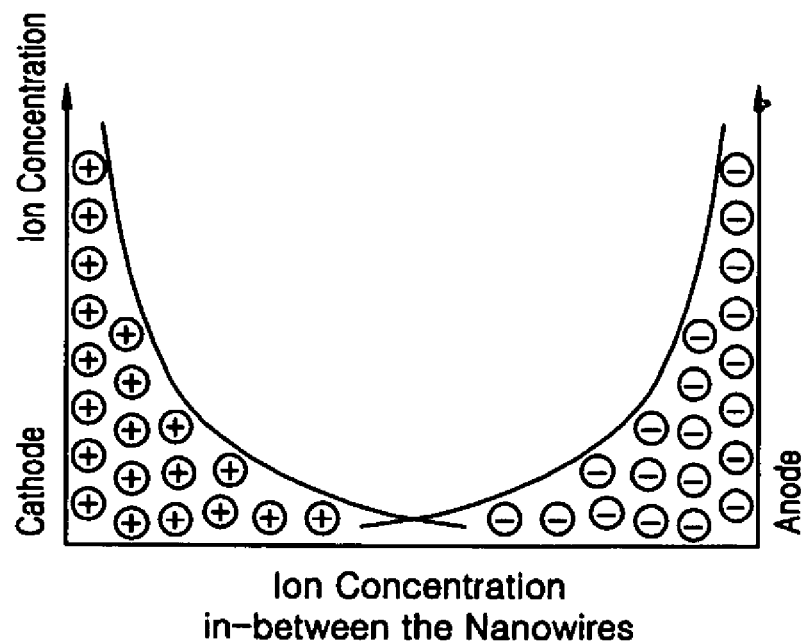
FIG. 2 is a graph of ion distribution in an electrolyte of a nanowire of the nanowire device of FIG. 1.
Figure 3:
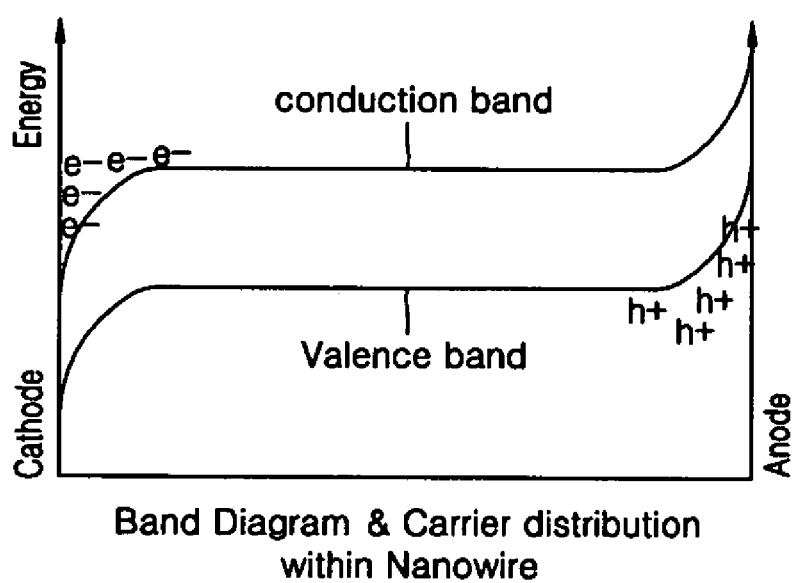
FIG. 3 is a carrier distribution graph and band diagram of a nanowire device of FIG. 1.

FIG. 2 is a graph of ion distribution in an electrolyte of a nanowire of the nanowire device of FIG. 1. FIG. 3 is a carrier distribution graph and band diagram of a nanowire device of FIG. 1.

FIGS. 4A through 4F are schematic diagrams illustrating a method of fabricating a nanowire device according to an exemplary embodiment of the present invention. Like reference numerals in the drawings denote like elements, and thus their description will be omitted.

Figure 4A:
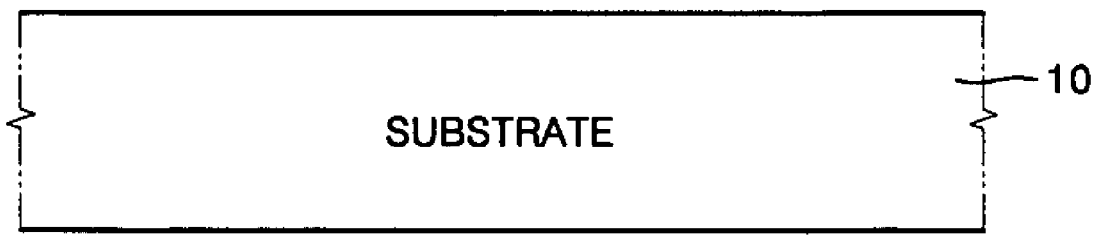
FIGS. 4A through 4F are schematic diagrams illustrating a method of fabricating a nanowire device according to an exemplary embodiment of the present invention.
Figure 4B:
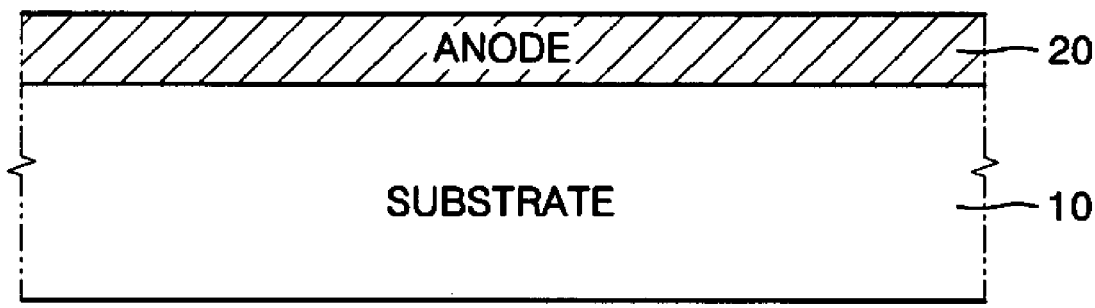

First, referring to FIGS. 4A and 4b, a first electrode layer 20 is formed on a prepared substrate 10 by a common thin film deposition method, for example, a chemical vapor deposition (CVD) method or a physical vapor deposition (PVD) method. The first electrode layer 20 can be made of a conductive material, such as indium tin oxide (ITO). ITO is known to have a high work function.

Figure 4C:
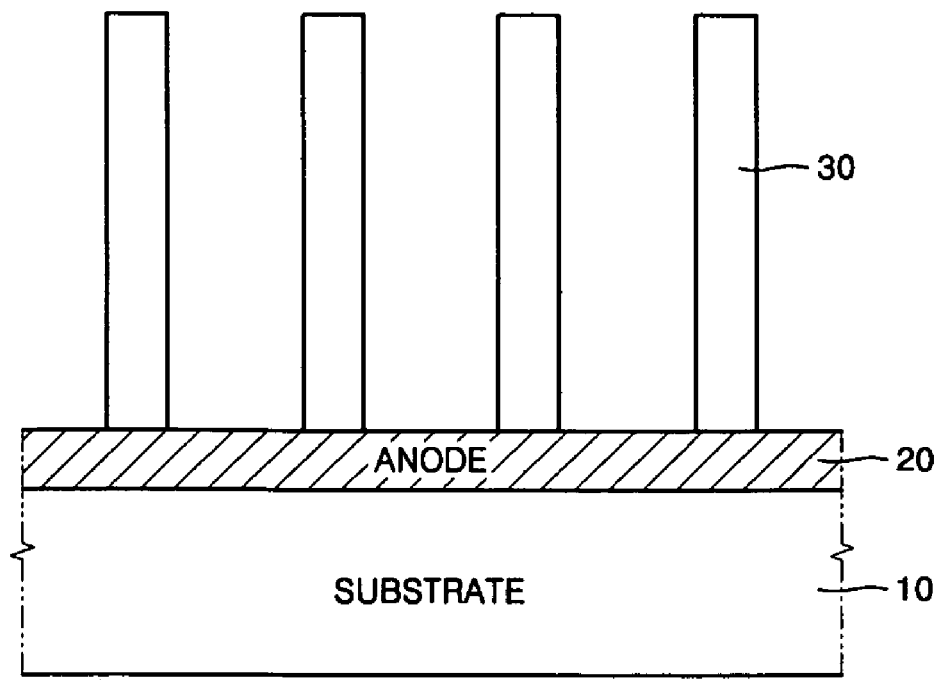

Referring to FIG. 4C, nanowires 30 are formed on the first electrode layer 20. In particular, a plurality of the nanowires 30 are formed vertically on the first electrode layer 20 at a predetermined interval. The nanowires 30 are made of at least one of ZnO, $SnO_2$, $In_2O_3$, NiO, GaN, $TiO_2$, MgO, Si, and carbon nanotubes (CNT). The nanowires 30 can also be formed using a metal-organic-vapor phase epitaxy (MOVPE) method. Using, for example, diethyl-zinc (DEZn) and oxygen as reaction sources, nanowires 30 composed of ZnO can be formed on the first electrode layer 20. The diameters of the nanowires 30 are about 1 µm or less, and the lengths of the nanowires 30 are about 10 µm or less. The nanowires 30 may be formed with a diameter of 5-200 nm and a length of 100 nm-2 µm. Methods of forming the nanowires 30 include, but are not limited to, a conventional vapor phase-liquid phase-solid phase (VLS) method, a conventional self-assembly method, a conventional growth method using a metal catalyst, a conventional growth method using nanocrystals, etc., as described, for example, in U.S. patent application Publication No. 2005/0161662 A1, incorporated herein by reference.

Figure 4D:
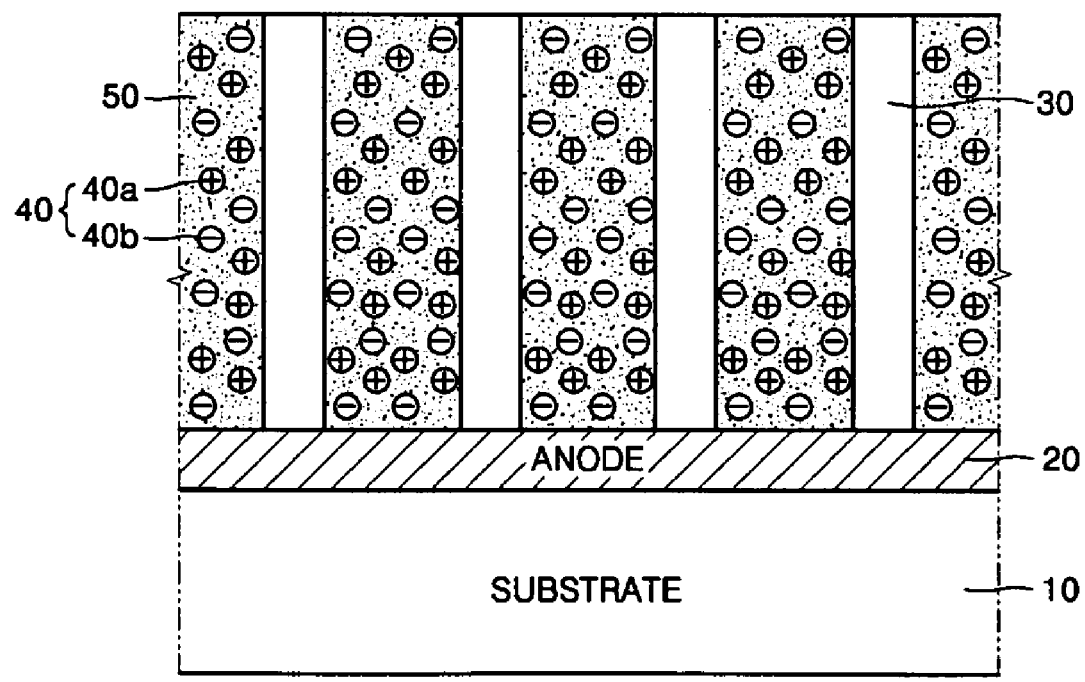

Referring to FIG. 4D, spaces between the nanowires 30 are filled with an electrolyte 50 containing an electrolytic salt 40. Here, the electrolytic salt 40 is dissociated into cations 40a and anions 40b and randomly dispersed in the electrolyte 50. The electrolytic salt 40 may include at least one of NaCl, $LiClO_4$, LiBr, LiI, $LiAsF_6$, $LiPF_6$, $LiAlCl_4$, $LiBF_4$, $LiCF_3SO_3$, $LiN(SO_2CF_3)_2$, $LiC(SO_2CF_3)_3$, $Li_2S_2O_4$, $TBABF_4$, $Li_2B_{10}Cl_{10}$, and $LiAlClO_4$. The electrolyte 50 may include at least one of a liquid electrolyte and a polymer electrolyte. The liquid electrolyte may include at least one of ethylene carbonate, propylene carbonate, ethyl methyl carbonate, diethyl carbonate, diethyl ether, tetrahydrofuran, 1,3-dioxolane, methylformate, γ-butyrolactone, methylacetate, acetonitrile, nitromethane, N,N-dimethyl formamide, dimethyl sulfoxide, sulfolane, methylene chloride, and water. Further, the polymer electrolyte may include at least one of polyethylene oxide, polypropylene oxide, polyacrylonitrile, polyvinylidene difluoride, polyoxymethylene-oligo-oxymethylene, and polymethylmethacrylate.

Figure 4E:
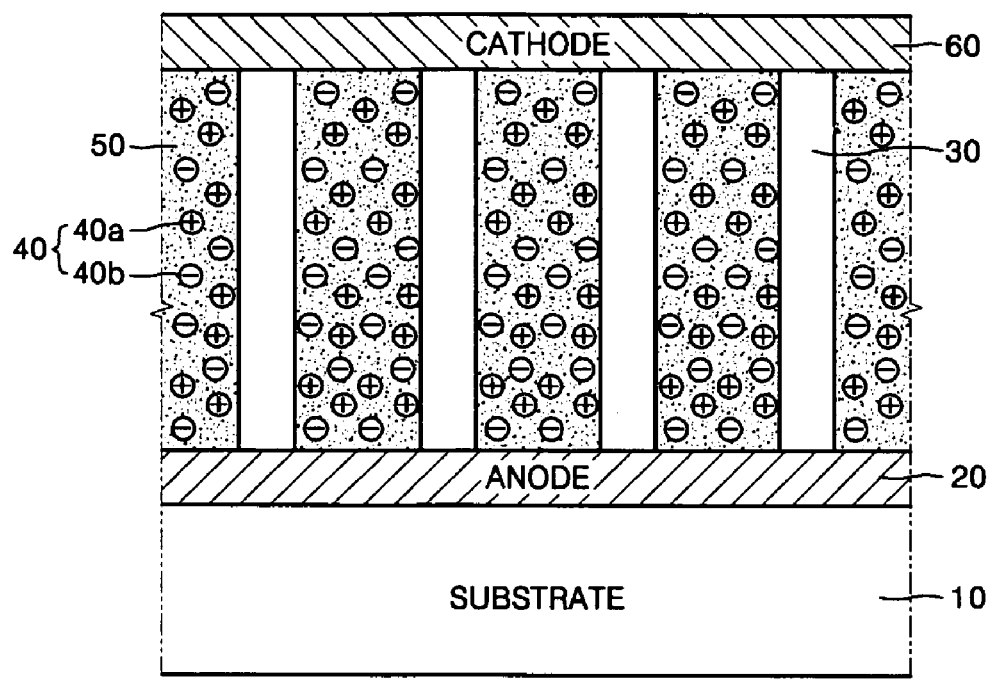

Referring to FIG. 4E, the second electrode layer 60 covering the electrolyte 50 and the nanowires 30 is formed, for example, by a CVD (chemical vapor deposition) process. The second electrode layer 60 may be formed of a conductive material, for example, a metal, such as aluminum, magnesium, Indium, calcium, etc. These metals have a low work function.

Figure 4F:
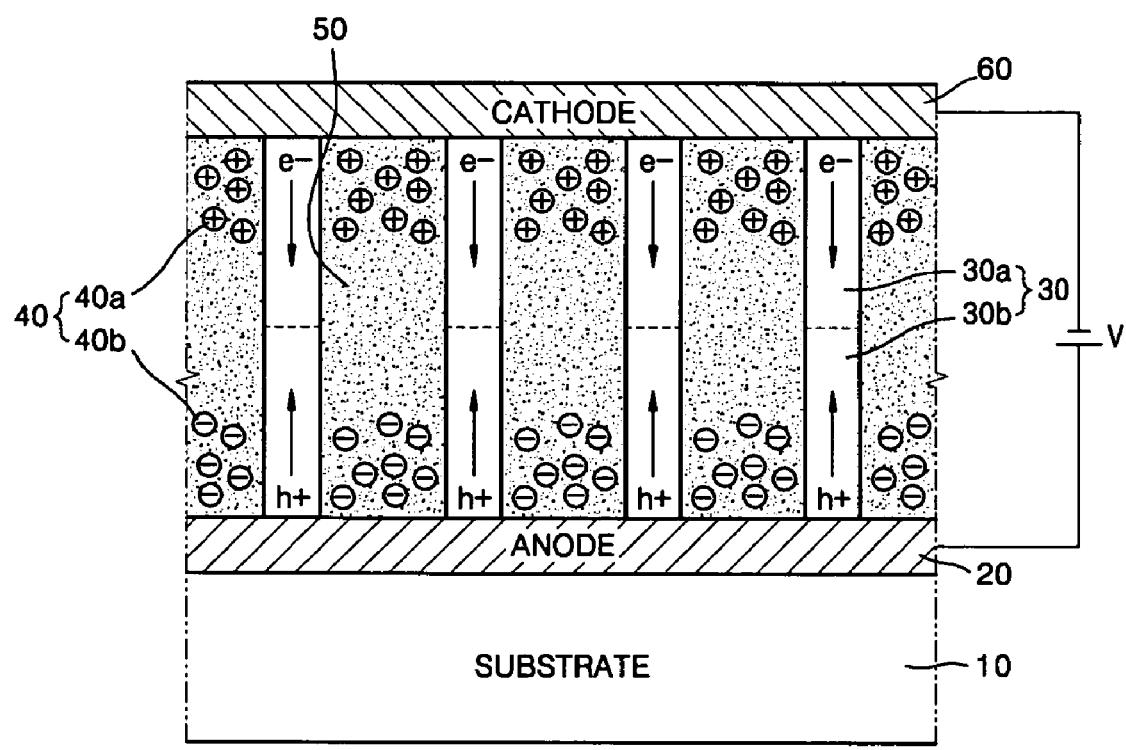

Referring to FIG. 4F, while using the first electrode layer 20 having a high work function as an anode electrode and the second electrode layer 60 having a low work function as an cathode electrode, a forward bias "V" is applied across to the nanowire device to inject holes and electrons into the nanowires 30. In particular, when the predetermined voltage "V" is applied to spaces between the first electrode layer (the anode electrode) 20 and the second electrode layer (the cathode electrode) 60, the dissociated cations 40a and anions 40b migrate to the cathode electrode 60 and the anode electrode 20, respectively, to thereby polarize the device.

The cations 40a migrating to the cathode electrode 60 actively attract electrons from the cathode electrode 60 by coulomb force to portions of the nanowires 30a near the cations 40a, forming an n-type doped portion 30a (by injection of electrons from the cathode electrode 60 to nanowires 30a). Similarly, anions 40b migrating to the anode electrode 20 actively attract holes from the anode electrode 20 by coulomb force to portions of nanowires 30b near the anions 40b, forming a p-type doped portion 30b.

Therefore, the n-type doped portion 30a and the p-type doped portion 30b can be formed in each of the nanowires 30 using such processes, resulting in a p-n junction nanowire device.

According to the present invention having the structure described above, nanowire devices having an improved structure can allow for easy formation of p-type and n-type doped portions in the nanowire. In particular, the nanowires according to the present invention have a superior p-n junction property as compared to conventional nanowires, thus improving device characteristics. Therefore, a light emitting device made of nanowire devices according to the present invention has improved light emitting efficiency due to its excellent p-n junction property.

The above-described nanowire devices and the method of fabricating the same according to the present invention can be applied to electronic devices having a nanowire structure, such as a light emitting diode (LED) and a solar cell.

While the present invention has been particularly shown and described with reference to exemplary embodiments and figures thereof, it will be understood by those of ordinary skill in the art that various changes in form and detail may be made therein without departing from the spirit and scope of the present invention as defined by the following claims.

What is claimed is:

1. A nanowire device comprising:
   a substrate;
   a first electrode layer formed on the substrate;
   a second electrode layer facing to the first electrode layer;
   a plurality of nanowires interposed at a predetermined interval between the first electrode layer and the second electrode layer to connect the same; and
   an electrolyte containing an electrolytic salt filling spaces between the nanowires.

2. The device of claim 1, wherein the nanowire is formed of at least one selected from the group consisting of zinc oxide (ZnO), tin dioxide ($SnO_2$), indium oxide ($In_2O_3$), nickel oxide (NiO), gallium nitride (GaN), titanium dioxide ($TiO_2$), magnesium oxide (MgO), silicon, and carbon nanotubes (CNT).

3. The device of claim 1, wherein the electrolytic salt comprises at least one selected from the group consisting of NaCl, $LiClO_4$, LiBr, LiI, $LiAsF_6$, $LiPF_6$, $LiAlCl_4$, $LiBF_4$, $LiCF_3SO_3$, $LiN(SO_2CF_3)_2$, $LiC(SO_2CF_3)_3$, $Li_2S_2O_4$, $TBABF_4$, $Li_2B_{10}Cl_{10}$, and $LiAlClO_4$.

4. The device of claim 1, wherein the electrolyte comprises at least one of a liquid electrolyte and a polymer electrolyte.

5. The device of claim 4, wherein the liquid electrolyte comprises at least one selected from the group consisting of ethylene carbonate, propylene carbonate, ethyl methyl carbonate, diethyl carbonate, diethyl ether, tetrahydrofuran, 1,3-dioxolane, methyl formate, γ-butyrolactone, methylacetate, acetonitrile, nitromethane, N,N-dimethyl formamide, dimethyl sulfoxide, sulfolane, methylene chloride, and water.

6. The device of claim 4, wherein the polymer electrolyte comprises at least one selected from the group consisting of ethylene oxide, polypropylene oxide, polyacrylonitrile, polyvinylidene difluoride, polyoxymethylene-oligo-oxymethylene, and polymethylmethacrylate.

7. A method of fabricating a nanowire device, the method comprising:
   preparing a substrate;
   forming a first electrode layer on the substrate;
   forming a plurality of nanowires vertically on the first electrode layer at a predetermined interval;
   filling spaces between the nanowires with an electrolyte containing an electrolytic salt; and
   forming the second electrode layer covering the electrolyte and the nanowires.

8. The method of claim 7, wherein the nanowires are formed of at least one selected from the group consisting of zinc oxide (ZnO), tin dioxide ($SnO_2$), indium oxide ($In_2O_3$), nickel oxide (NiO), gallium nitride (GaN), titanium dioxide ($TiO_2$), magnesium oxide (MgO), silicon, and carbon nanotubes (CNT).

9. The method of claim 7, wherein the electrolytic salt comprises at least one selected from the group consisting of NaCl, $LiClO_4$, LiBr, LiI, $LiAsF_6$, $LiPF_6$, $LiAlCl_4$, $LiBF_4$, $LiCF_3SO_3$, $LiN(SO_2CF_3)_2$, $LiC(SO_2CF_3)_3$, $Li_2S_2O_4$, $TBABF_4$, $Li_2B_{10}Cl_{10}$, and $LiAlClO_4$.

10. The method of claim 7, wherein the electrolyte comprises at least one of a liquid electrolyte and a polymer electrolyte.

11. The method of claim 10, wherein the liquid electrolyte comprises at least one selected from the group consisting of ethylene carbonate, propylene carbonate, ethyl methyl carbonate, diethyl carbonate, diethyl ether, tetrahydrofuran, 1,3-dioxolane, methyl formate, γ-butyrolactone, methylacetate, acetonitrile, nitromethane, N,N-dimethyl formamide, dimethyl sulfoxide, sulfolane, methylene chloride, and water.

12. The method of claim 10, wherein the polymer electrolyte comprises at least one selected from the group consisting of polyethylene oxide, polypropylene oxide, polyacrylonitrile, polyvinylidene difluoride, polyoxymethylene-oligo-oxymethylene, and polymethylmethacrylate.

13. A light emitting or light receiving device comprising the nanowire device of claim 1.

* * * * *